(12) United States Patent
Molla et al.

(10) Patent No.: US 11,437,276 B2
(45) Date of Patent: Sep. 6, 2022

(54) PACKAGED DIES WITH METAL OUTER LAYERS EXTENDING FROM DIE BACK SIDES TOWARD DIE FRONT SIDES

(71) Applicant: NXP USA, Inc., Austin, TX (US)

(72) Inventors: Jaynal A Molla, Gilbert, AZ (US); Lakshminarayan Viswanathan, Phoenix, AZ (US); David Abdo, Scottsdale, AZ (US); Colby Greg Rampley, Phoenix, AZ (US); Fernando A. Santos, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 46 days.

(21) Appl. No.: 16/920,462

(22) Filed: Jul. 3, 2020

(65) Prior Publication Data

US 2020/0335398 A1   Oct. 22, 2020

Related U.S. Application Data

(62) Division of application No. 15/642,155, filed on Jul. 5, 2017, now Pat. No. 10,741,446.

(51) Int. Cl.
*H01L 21/78* (2006.01)
*H01L 21/3065* (2006.01)
(Continued)

(52) U.S. Cl.
CPC ............ *H01L 21/78* (2013.01); *H01L 21/304* (2013.01); *H01L 21/3065* (2013.01);
(Continued)

(58) Field of Classification Search
CPC ... H01L 21/78; H01L 21/304; H01L 21/3065; H01L 21/30655; H01L 21/6835; H01L 24/03; H01L 24/05; H01L 24/32; H01L 24/81; H01L 2221/68327; H01L 2221/6834; H01L 2221/68368; H01L 2224/03002; H01L 2224/04026; H01L 2224/05139; H01L 2224/05144;
(Continued)

(56) References Cited

U.S. PATENT DOCUMENTS

| | | | |
|---|---|---|---|
| 2008/0128908 A1* | 6/2008 | Zimmerman | ........... H01L 24/29 257/751 |
| 2014/0367717 A1* | 12/2014 | Freund | .................... H01L 33/20 257/98 |

(Continued)

*Primary Examiner* — Herve-Louis Y Assouman
*Assistant Examiner* — Christopher A Culbert (57) ABSTRACT

A method of wafer dicing includes singulating dies from a semiconductor wafer. The method further includes depositing a metal layer on back sides of the singulated dies, wherein a portion of the metal layer continues beyond the backs sides of the singulated dies to deposit at least partially on lateral sides of the singulated dies. A packaged die includes a semiconductor die and a metal outer layer deposited on the back side of the semiconductor die and on a portion of the lateral side of the semiconductor die nearest the back side. The packaged die further includes a substrate mounted to the back side of the semiconductor die a die attach material that bonds the substrate to the metal outer layer deposited on the semiconductor die, wherein the metal outer layer and the die attach material surround the back edge of the semiconductor die.

20 Claims, 9 Drawing Sheets

(51) Int. Cl.
*H01L 21/304* (2006.01)
*H01L 21/683* (2006.01)
*H01L 23/00* (2006.01)

(52) U.S. Cl.
CPC .... *H01L 21/30655* (2013.01); *H01L 21/6835* (2013.01); *H01L 24/03* (2013.01); *H01L 24/05* (2013.01); *H01L 24/32* (2013.01); *H01L 24/81* (2013.01); *H01L 2221/6834* (2013.01); *H01L 2221/68327* (2013.01); *H01L 2221/68368* (2013.01); *H01L 2224/03002* (2013.01); *H01L 2224/04026* (2013.01); *H01L 2224/05139* (2013.01); *H01L 2224/05144* (2013.01); *H01L 2224/05147* (2013.01); *H01L 2224/05155* (2013.01); *H01L 2224/32245* (2013.01); *H01L 2224/83005* (2013.01); *H01L 2224/838* (2013.01); *H01L 2224/8384* (2013.01); *H01L 2224/83801* (2013.01)

(58) Field of Classification Search
CPC . H01L 2224/05147; H01L 2224/05155; H01L 2224/32245; H01L 2224/83005; H01L 2224/838; H01L 2224/83801; H01L 2224/8384
See application file for complete search history.

(56) References Cited

U.S. PATENT DOCUMENTS

2016/0240454 A1\* 8/2016 Perkins ............... H01L 23/4821
2018/0240737 A1\* 8/2018 Tu ......................... H01L 23/535
2018/0323128 A1\* 11/2018 Dias ................... H01L 25/0657

\* cited by examiner

PACKAGED DIES WITH METAL OUTER LAYERS EXTENDING FROM DIE BACK SIDES TOWARD DIE FRONT SIDES

CROSS-REFERENCE TO RELATED APPLICATION

This application is a divisional of co-pending, U.S. patent application Ser. No. 15/642,155, filed on Jul. 5, 2017.

FIELD

The present disclosure relates generally to singulating and metalizing dies and more particularly to metalizing the back sides of a plurality of dies after singulation from a semiconductor wafer for use in packaged dies.

BACKGROUND

Plasma dicing, also referred to as deep reactive ion etching, is a dry etching technology used to singulate dies from semiconductor wafers. Plasma dicing can be implemented as a parallel process to dice whole semiconductor wafers simultaneously and therefore more quickly than a laser, for example, which gradually singulates dies using multiple passes.

When compared with a saw singulation process, plasma dicing also minimizes cutting kerf, leaving more of a semiconductor wafer intact, and reduces mechanical damage imparted to the edges of dies resulting from the singulation of the wafer. Sawing with a diamond-tipped blade can leave a saw street roughly 85 microns wide as compared to approximately 5 to 10 microns in width for plasma dicing. Stresses and microcracks caused by the mechanical interaction between the saw blade and a semiconductor wafer can lead to failures in the resulting dies when they are operationally cycled in power and temperature. Edge damage from sawing is increasingly likely with thin dies having a thickness of 50 microns or less. Even absent sawing, damage to a die edge can occur after singulation from routine handling.

Particular dies benefit from being manufactured with a metal backing. A metal back layer ads strength to thin dies and also provides advantageous thermal, electronic, and electromagnetic (EM) properties. A metal backing can operate as a heat sink for a power chip, as a common ground for a chip's multiple electronic components, or excite certain EM wave propagation modes for a radio frequency (RF) chip.

The standard method of providing a metal backing on dies is to deposit a metal layer on the back side of a semiconductor wafer before singulating dies from the wafer. Singulation is typically carried out via sawing. While plasma dicing is preferable for singulating semiconductor wafers, the dry etching technology is incompatible with metal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

The present disclosure is illustrated in part with examples, as reflected by disclosed embodiments, and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to the dimensions of other elements to help to improve understanding of embodiments implicitly or explicitly disclosed herein.

The apparatus and method components have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Also, the operations included in the flow diagrams do not imply a required order in performing the functionality contained therein.

DETAILED DESCRIPTION

Described embodiments allow for semiconductor wafer singulation using plasma dicing, also referred to as plasma etching, when singulated dies are to have a metal backing, such as in the case of dicing RF power wafers. Additional embodiments are directed to creating a packaged die whereby an edge of a singulated die having a metal backing is connected to a substrate with a die attachment material.

In accordance with one embodiment, a method of wafer dicing for backside metalization includes singulating dies from a semiconductor wafer, wherein each singulated die has a back side opposite a front side and adjacent to a lateral side. The back and front sides of the dies correspond to opposing back and front sides of the semiconductor wafer. The method further includes depositing a metal outer layer on the back sides of the singulated dies, wherein a portion of the metal outer layer continues beyond the backs sides of the singulated dies to deposit at least partially on the lateral sides of the singulated dies.

In accordance with another embodiment is a packaged die with a semiconductor die having a front side opposite a back side, a lateral side adjacent to the front and back sides, and a back edge where the back and lateral sides meet. The packaged die also includes a metal outer later deposited on the back side of the semiconductor die and on a portion of the lateral side of the semiconductor die nearest the back side. For a particular embodiment, the packaged die further includes a substrate (e.g., a conductive flange) mounted to the back side of the semiconductor die and a die attach material that bonds the substrate to the metal outer layer deposited on the semiconductor die, wherein the metal outer layer and the die attach material may surround the back edge of the semiconductor die.

A semiconductor wafer is also referred to as simply a wafer. Similarly, the words "semiconductor die," "singulated die," and "die" are used interchangeably herein. A wafer, and by extension, a die, can be made of any semiconductor material or combination of materials. Such materials include, but are not limited to, gallium nitride, gallium arsenide, silicon germanium, silicon-on-insulator (SOI), and monocrystalline or other forms of silicon.

Figure 1:
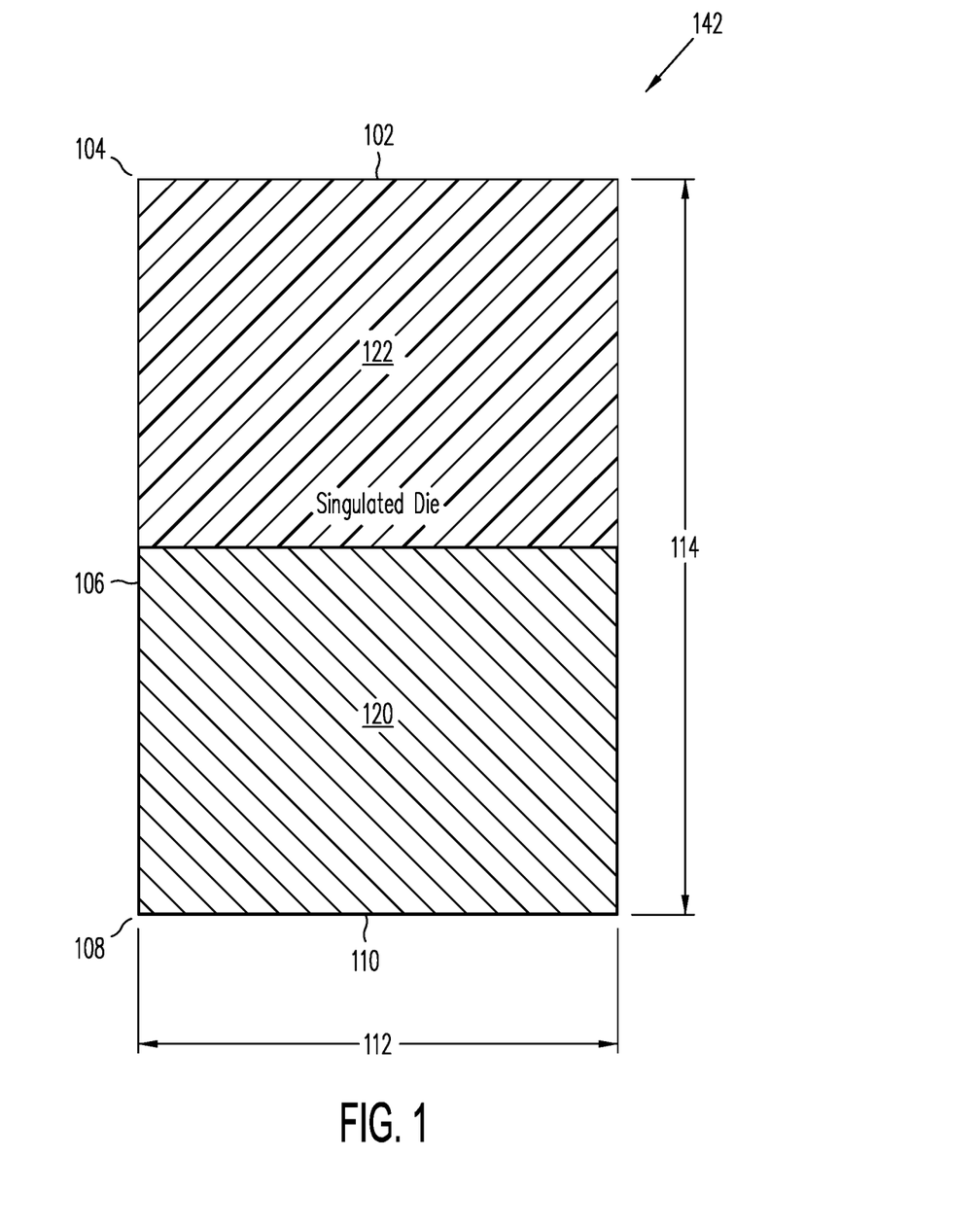
FIG. 1 shows a cross-sectional view illustrating relevant parts of a singulated semiconductor die, in accordance with described embodiments.

Referring now to the drawings, FIG. 1 shows a cross-sectional representation of a singulated die 142 and portions thereof relevant in describing presented embodiments. The singulated die 142 includes a base semiconductor substrate 120 and a plurality of conductive and insulative build up layers 122 overlying a surface of the base semiconductor substrate 120. A front side 102 of the die 142 is the active side of the die, and the front side 102 of the die 142 corresponds to an exterior surface of an outermost one of the build up layers 122. The active side includes integrated circuit components, which are active when the die 142 is powered. A back side 110 of the die 142 is opposite the front side 102, and the back side 110 of the die 142 corresponds to an exterior surface of the base semiconductor substrate 120. A distance between the front 102 and back 110 sides of the die 142 represents its thickness 114. Similarly, a thickness of a wafer is the distance between a front side and a back side of a wafer from which the die 142 was singulated, where the front side of the wafer, being the active side of the wafer, is opposite the back side of the wafer.

Adjacent to the both the front 102 and back 110 sides of the die 142 is a lateral side 106 of the die 142, which runs parallel or approximately parallel to the thickness 114 of the die 114. Unless expressly stated otherwise, the lateral side of a die as written in the singular is understood to include a plurality of lateral sides. The lateral side of a die having rectangular front and back sides, for example, can refer to one, two, three, or all four lateral sides in any combination. A width 112 of the die 142 is shown as the distance across the back side 110 of the die 142. In some instances, a die will have different measured widths, depending on if the measurement is taken at a back side or a front side of the die, for example, if the die has a non-vertical lateral profile, and/or if the measurement is side-to-side, corner-to-corner, or side-to corner.

A front edge 104 of the die 142 is defined by the intersection of the front side 102 with the lateral side 106. Analogously, a back edge 108 of the die 142 is defined by the intersection of the back side 110 with the lateral side 106. Where the back 110 side of the die 142 is characterized by a square, for example, the back edge 108 of the die 142 is the perimeter of the square. Unless expressly stated otherwise, the front edge 104 or back edge 108 of a die as written in the singular is understood to include a plurality of edges. The front edge of a die having a rectangular front side, for example, can refer to one, two, three, or all four front edges in any combination.

Figure 2:
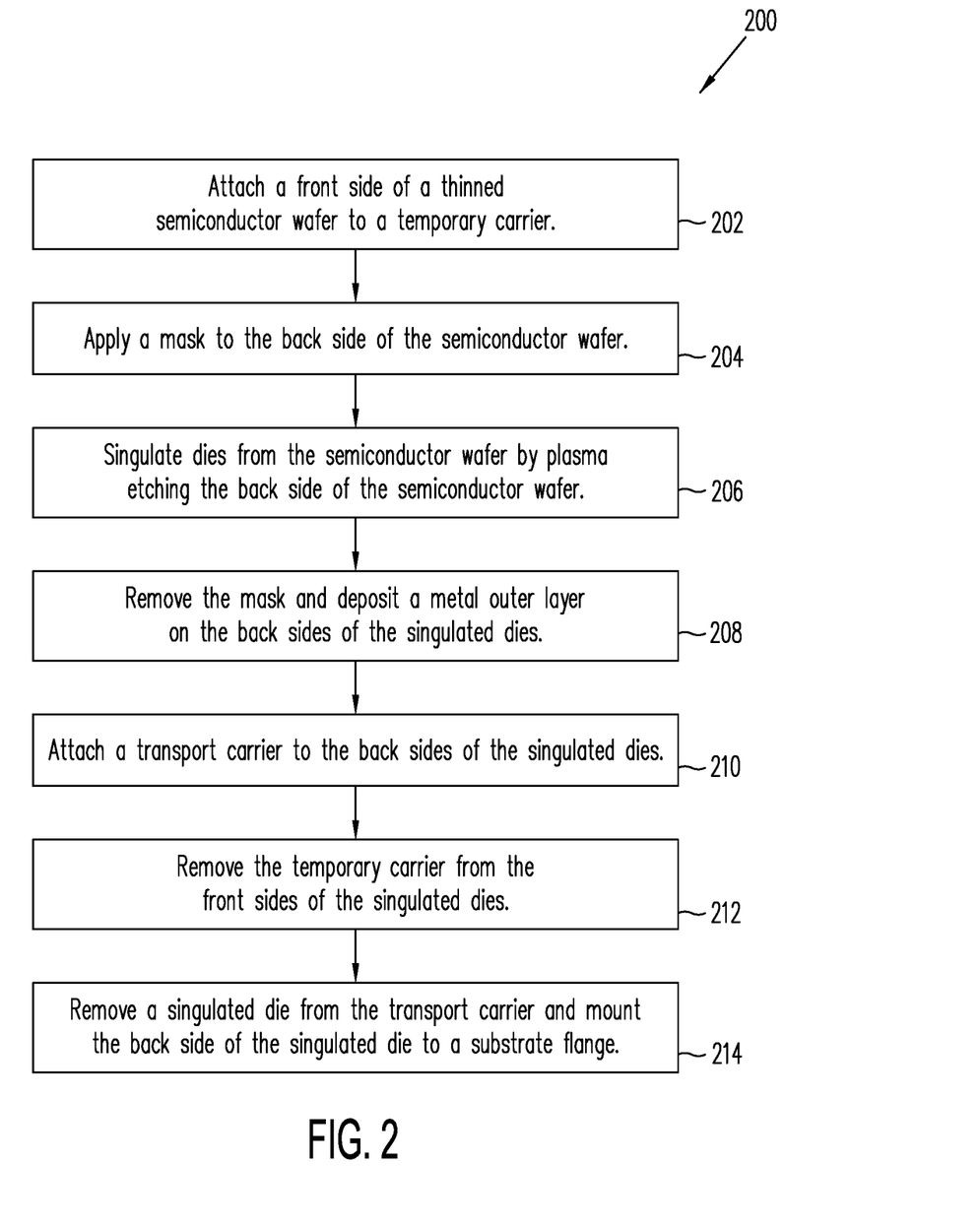
FIG. 2 shows a logical flow diagram illustrating a method for singulating and metalizing dies, in accordance with some embodiments.
Figure 3:
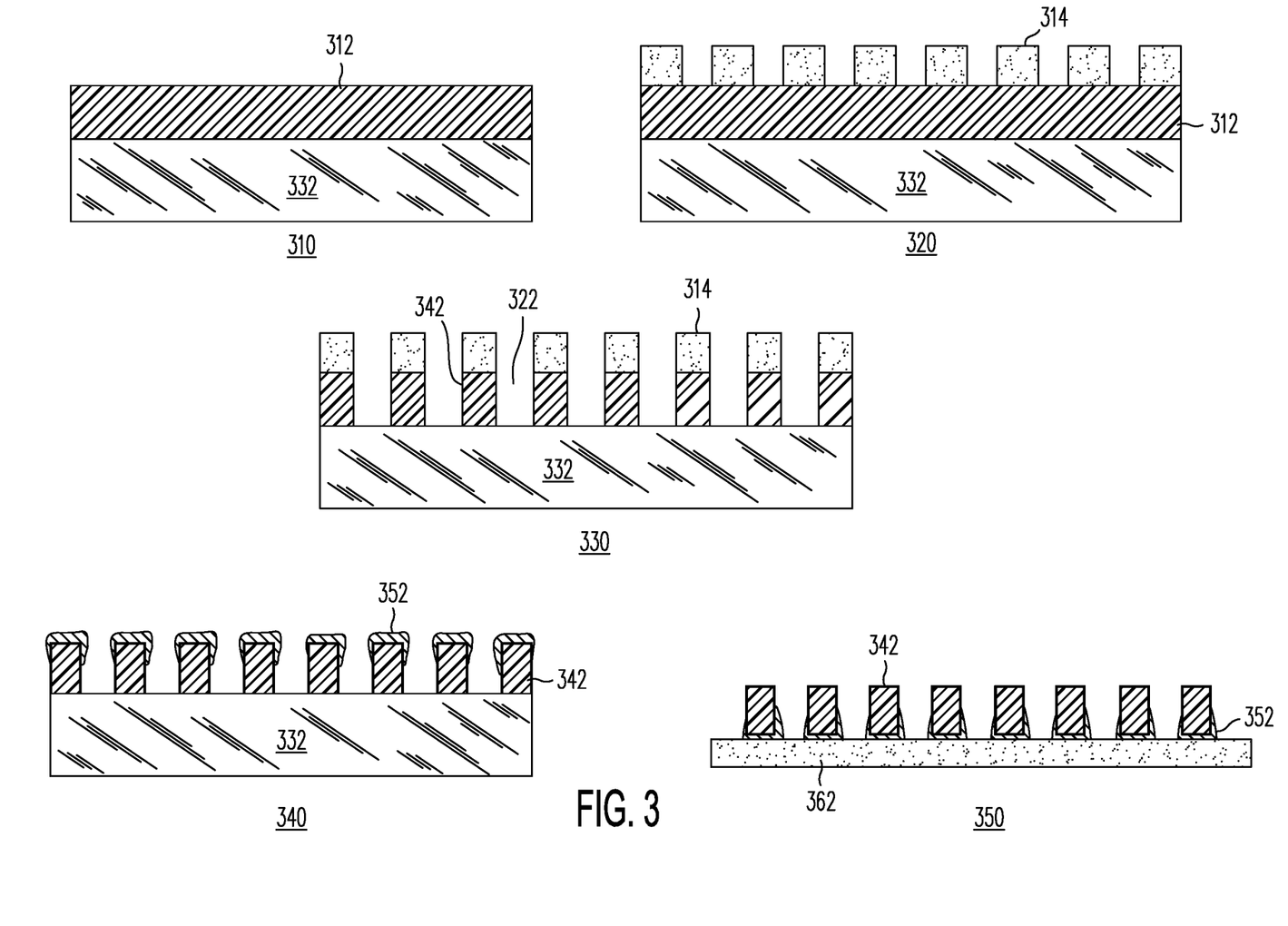
FIG. 3 shows a sequence of cross-sectional views illustrating dies being singulated and metalized, in accordance with some embodiments.

FIG. 2 shows a method 200, illustrated as a logical flow diagram, for singulating dies by dicing post grinding (DPG) prior to depositing a metal outer layer on the back sides of the singulated dies. The method 200 is described with reference to FIG. 3, which includes five corresponding cross-sectional views 310, 320, 330, 340, 350. In particular, FIG. 3 shows a thinned semiconductor wafer 312, a mask 314, a temporary carrier 332, singulated dies 342, a deposited metal outer layer 352, and a transport carrier 362.

The method 200 begins with attaching 202 a front side of the semiconductor wafer 312 to the temporary carrier 332, as shown in view 310. Before dicing, the wafer 312 is thinned to a thickness of between about 15 and about 100 micrometers, although the thinned wafer 312 may be thinner or thicker than this range, as well. In a particular embodiment, the wafer is thinned to approximately 50 micrometers. The temporary carrier 332 to which the thinned wafer 312 is attached holds and supports the wafer 312 as the wafer 312 is diced into the singulated dies 342, as described below. The temporary carrier 332 additionally protects the front side of the wafer 312 from damage during the singulation process and masks the front sides of the singulated dies 342 during metalization. Further, the temporary carrier 332 preserves relative positions between the singulated dies 342 so those dies 342 falling short of quality control standards can be tracked and later separated to prevent their use.

In some embodiments, the temporary carrier 332 is made from a rigid material to better hold, support, protect, and preserve the relative positions of the singulated dies 342. In a particular embodiment, the temporary carrier 332 is a glass carrier. The temporary nature of the carrier 332 is realized by using an adhesive layer and a carrier release layer on the attachment surface of the carrier 332 (i.e., the surface facing the wafer 312) that allows the carrier 332 to be removed from the front sides of the dies 342 after singulation and metalization (e.g., after view 340). A glass carrier, for example, passes light from a laser, where the light neutralizes the carrier release layer to release the glass carrier from the singulated dies 342. In other embodiments, heat and/or vibrations, such as ultrasonic vibrations, are used to release the temporary carrier 332 from the singulated dies 342.

After the front side of the wafer 312 is attached to the temporary carrier 332, the method 200 continues with the application 204 of the mask 314 to the back side of the thinned wafer 312, as shown in view 320. The mask 314 is patterned to expose areas on the back side of the wafer 312 that are to be etched. Those areas covered by the mask 314 are not etched, and those areas not covered by the mask 314 are etched. For some embodiments, lithography is used to pattern a photoresist, such as a light-sensitive polymer, on the back side of the wafer 312 to act as the mask 314. In other embodiments, the entire back side of the wafer 312 is covered by the mask 314, and portions of the mask 314 covering areas to be etched are ablated, for example, by using a laser. In one embodiment, a passivation layer of silicon dioxide serves as the mask 314.

With the mask 314 in place, etching the thinned wafer 312 singulates 206 the dies 342. For example, deep reactive ion etching (DRIE), or equivalently, plasma dicing, is the method used. In this process, a high-speed stream of neutral or charged particles (i.e., etch species) is incident upon areas of the thinned wafer 312 not protected by the mask 314. For various embodiments, the stream of particles includes radicals which are chemically reactive and more aggressively attack areas of the wafer 312 being etched over high-speed mechanical ablation alone.

Etching the back side of the semiconductor wafer by plasma dicing continues until the dies 342 are completely singulated in that each of the dies 342 are physically dissociated from any and all neighboring dies by a kerf or die street 322, as shown in view 330. The method 200 then continues with the removal 208 of the mask 314 from the back sides of the singulated dies 342 before depositing 208 the metal outer layer 352 on the back sides of the dies 342.

A metal outer layer, as used herein, is a topmost or last metal layer of a plurality of stacked metal layers that are deposited on the backsides of singulated dies. Gold, for example, is the metal outer layer 352 where a titanium barrier layer is deposited directly over the singulated dies 342 with a nickel-vanadium alloy layer deposited over the titanium layer and the gold deposited as a final layer over the nickel-vanadium layer. This stacking of metal layers is denoted as Ti—NiV—Au. A non-exhaustive list of other stacked metal layers consistent with embodiments described herein includes Ti—NiV—Au, Ti—NiV—Ag, Ti—Au, Ti—Ag, and Au—Ag—Au. For embodiments for which only a single metal layer is deposited over the singulated dies 342, such as when only gold is deposited on the back sides of the dies 342, the single metal layer is the metal outer layer 352. In different embodiments, the metal outer layer 352 is gold (Au), silver (Ag), copper (Cu), or nickel (Ni) or any of these metals alloyed with one another or a different metal. For various embodiments, the metal outer layer 352 is between about 1.5 and about 20 kiloangstroms (kÅ) in thickness, although the metal outer layer 352 may be thinner or thicker, as well. For a particular embodiment, the metal outer 352 layer is approximately 5 kÅ in thickness.

The metal outer layer 352, and any metal layers underneath (not illustrated) in the case of layer stacking, are deposited on the back sides of the singulated dies 342 as shown in view 340. According to an embodiment, the metal outer layer 352 is simultaneously deposited on the back sides of the plurality of singulated dies 342 while the plurality of singulated dies 342 are held in fixed relative positions, with respect to each other, by the temporary carrier 332. The metal outer layer 352 is deposited by sputtering, spin coating, chemical vapor deposition (CVD), physical vapor deposition (PVD), electroplating, conformal depositing, or any other means of depositing metal on the backsides of the singulated dies 342. In an embodiment, a portion of the metal continues beyond the back sides of the dies 342 to deposit at least partially on the lateral sides of the dies 342. A portion of a metal outer layer depositing at least partially on the lateral side of a die means that some of the metal outer layer extends beyond the back side of the die to deposit on an area of the lateral side of the die. The areas of the lateral sides of the singulated dies 342 on which a portion of the metal outer layer 352 is deposited is located adjacent to the back edges of the dies 342. View 340 shows the areas of the lateral sides of the singulated dies 342 adjacent to the front edges of the dies 342 are kept free from the metal outer layer 352. This is to prevent the conductive metal outer layer 352, and any metal layers stacked underneath, from causing short circuits or other complications on the active sides of the dies 342. In various embodiments, between 20 and 80 percent of the lateral sides of the dies 342 nearest the front edges are kept free of the metal outer layer 352. In a particular embodiment, approximately 50 percent of the lateral sides of the dies 342 nearest the front edges are kept free of the metal outer layer 352. In some embodiments in which the conductive build up layers do not extend to the lateral sides of the dies 342, the metal outer layer 352 could extend to the front sides of the dies 342.

Figure 4:
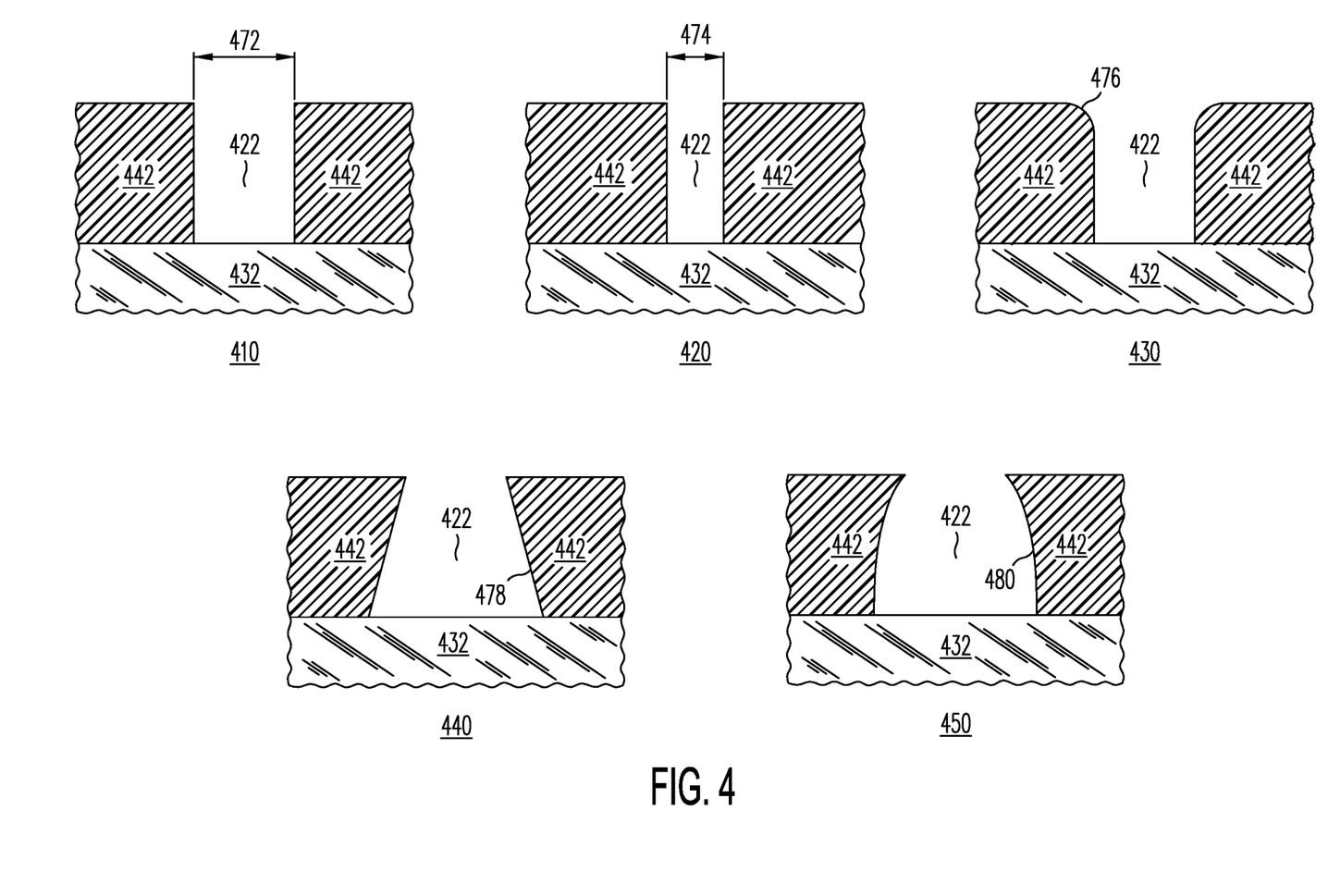
FIG. 4 shows a set of cross-sectional views illustrating adjustment parameters for control over metal deposition after singulation, in accordance with some embodiments.

For some embodiments, at least one adjustment parameter controls the portion of the metal outer layer 352 that continues beyond the backs sides of the singulated dies 342 to deposit partially on the lateral sides of the singulated dies 342. Turning momentarily to FIG. 4, particular adjustment parameters are described with reference to views 410, 420, 430, 440, and 450. Each view shows neighboring singulated dies 442 attached to a temporary carrier 432 and separated by a plasma-etched kerf 422. In each of the views 420, 430, 440, and 450, a different geometry of the kerf 422, as compared to the view 410, illustrates a different adjustment parameter. These adjustment parameters are applied to the singulated dies 442 independently or in any combination. Varying the one or more adjustment parameters provides control over the portion of the metal outer layer 352 deposited on the lateral sides of the singulated dies 442.

A first adjustment parameter includes an aspect ratio of a distance between the singulated dies 442 to a thickness of the singulated dies 442 when depositing the metal outer layer 352. This adjustment parameter is illustrated by comparing views 410 and 420. In both views 410, 420, the thickness of the neighboring dies 442 is the same. The distance between the dies 442, however, varies. As shown, a distance 474 between the dies 442 in view 420 is less than a distance 472 between the dies 442 in view 410. Therefore, the aspect ratio of the distance between the singulated dies 442 to the thickness of the singulated dies 442 is lowered in adjusting the kerf 422 from the distance 472 to the distance 474. The smaller kerf 422 in view 420, as compared to view 410, results in less metal getting into the kerf 422 between the dies 442. The lower aspect ratio shown in view 420, as compared to view 410, limits the depth to which the metal outer layer 352 deposits on the lateral sides of the dies 442. For one embodiment, the metal outer layer deposits on approximately two thirds of the lateral sides of the dies 442, as measured from the back sides of the dies 442. In an embodiment, the distance 472, 474 defining the kerf 474 is approximately 10 microns, although distance 472, 474 may be narrower or wider, as well.

A second adjustment parameter includes a front edge curvature 476 of the front edge of the singulated dies 442. This adjustment parameter is illustrated by view 430. In adjusting for more front edge curvature 476, as compared to view 410, more of the metal outer layer 352 being deposited "rolls" around the smoothed front edges to deposit on the lateral sides of the dies 442. For one embodiment, the front edge curvature 476 represents a circular arc in that it is described by a radius. In other embodiments, the front edge curvature 476 represents any nonlinear convex profile.

For some embodiments, the at least one adjustment parameter controlling the portion of the metal outer layer 352 that continues beyond the backs sides of the singulated dies 442 to deposit partially on the lateral sides of the singulated dies 442 includes a profile of the lateral sides of the singulated dies 442 when depositing the metal outer layer 352. This is illustrated by views 440 and 450.

In view 440, a third adjustment parameter includes a lateral slope 478 of the lateral sides of the singulated dies 442. Here, the lateral side profile of the dies 442 is approximately linear. As shown, the lateral slope 478 is negative in that the kerf 422 increases in width from the back sides to the front sides of the neighboring dies 442. In other embodiments, the lateral slope 478 is positive, with the width of the kerf 422 decreasing from the back sides to the front sides of the neighboring dies 442. As the lateral slope 478 decreases from a positive value, through zero (vertical sidewalls), to a negative value (shown), a smaller portion of the metal outer layer 352 continues beyond the backs sides of the neighboring dies 442 to deposit partially on the lateral sides of the dies 442.

In view 450, a fourth adjustment parameter includes a lateral curvature 480 of the lateral sides of the singulated dies 442. Here, the lateral side profile of the dies 442 is nonlinear. As shown, the lateral curvature 480 is concave between the neighboring dies 442 with the width of the kerf 422 increasing from the back sides to the front sides of the neighboring dies 442. In other embodiments, the lateral curvature 480 can be concave or convex with the width of the kerf 422 either increasing or decreasing from the back sides to the front sides of the neighboring dies 442. Concave curvature, as compared to convex curvature, and increasing the width of the kerf 422, as compared to decreasing the width of the kerf 422, in the direction toward the front sides of the neighboring dies 442 results in a smaller portion of the metal outer layer 352 being deposited on the lateral sides of the dies 442.

For some embodiments, generating an etch profile in accordance with described adjustment parameters is achieved using a Bosch process in plasma etching the kerf 422 between neighboring dies 442. A plasma steam of sulfer hexaflouride ($SF_6$), for example, creates an isotropic etch of the wafer 312. As the kerf 422 is etched vertically deeper, material continues to be removed from the exposed sides of the partially formed kerf 422. Allowing this lateral etching to continue results in an etch profile having a kerf 422 that narrows with depth. To stop the continued lateral etching, the etching is intermittently halted to create a chemically inert passivation layer on newly exposed portions of the kerf 422 sidewalls. The sidewalls are exposed to octafluorocyclobutane ($C_4F_8$) gas, for instance, to create a hardened passivation layer that resists further etching. By varying the intervals of time during which etching occurs before stopping to extend the passivation layer, different lateral etching profiles are realized. Etching for increasingly extended periods of time before lateral passivation, for example, creates a kerf 422 which increases in width in the vertical etching direction.

Returning to FIG. 2, the method 200 continues, after depositing 208 the metal outer layer 352 on the back sides of the singulated dies 342, with attaching 210 the backsides of the dies 342 to the transport carrier 362 and then removing 212 the front sides of the dies 342 from the temporary carrier 332. Attaching the transport carrier 362 to the back sides of the singulated dies 342 before removing the temporary carrier 332 from the front sides of the dies 342 preserves the relative positions of the singulated dies 342 on the transport carrier 362. In this way, individual dies 342 may be mapped and tracked by position until a final mounting process (e.g., a pick-and-place process) for which dies 342 falling short of quality control standards are not selected. The view 350 shows the temporary carrier 362 attached to the back sides of the dies 342 and the temporary carrier 332 released from the front sides of the dies 342. The dies 342 are rotated from a back-side-up orientation in view 340 to a back-side-down orientation in view 350.

The transport carrier 362 is a material device that secures the singulated dies 342 in fixed relative positions for transport from a location where the dies 342 are singulated and metalized to a location where the dies 342 undergo further processing, such as being mounted on a substrate (e.g., a conductive flange) to form a packaged die. The transport carrier 362 allows for the dies 342 to be released when needed, and is in some instances made from a more economical material than the temporary carrier 332, which is reused after its detachment.

In one embodiment, the transport carrier 362 is an ultraviolet (UV) transparent tape. A UV-sensitive adhesive on the tape is weakened or neutralized with exposure to UV light, releasing the attached dies 342. In other embodiments, the transport carrier 362 is a ribbon or sheet having an adhesive, or other means of attachment, by which individual dies 342 are separated from the carrier 362 under the influence of a force. For example, individual dies 342 are removed 214 from the transport carrier 362 using a pressure ejection method or a vacuum pickup method. In further embodiments, the application of heat and/or simply grasping and pulling the dies 342 releases them from the transport carrier 362, which may be flexible or rigid.

Figure 5:
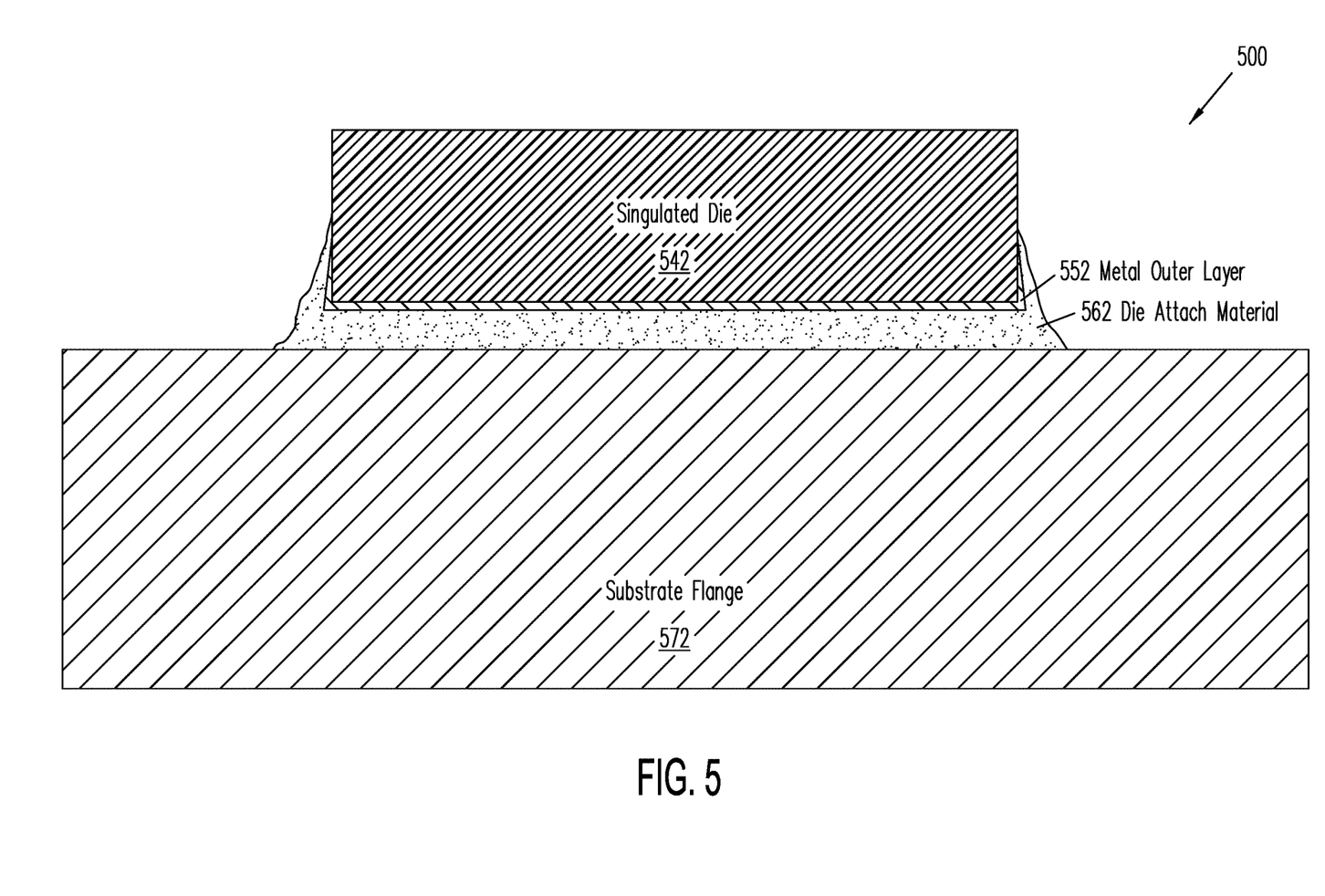
FIG. 5 shows a cross-sectional view of a packaged die, in accordance with some embodiments.

Now referencing FIG. 5, the method 200 ends with removing 214 a singulated die 542 from the transport carrier 362 and mounting 214 the back side of the die 542 to a substrate 572 (e.g., a conductive flange). The backside of the die 542 is mounted to the substrate 572 using a die attach material 562 that bonds to a metal outer layer 552 deposited on the backside and deposited at least partially on the lateral side of the die 542. An assembly that includes a die with a metal outer layer joined to a substrate is referred to herein as a packaged die. A packaged die 500 results from mounting the die 542 to the substrate 572.

A substrate is an object to which the back side of a metalized die is permanently mounted so that the substrate accompanies the die in use for the purpose for which the die was designed. As pictured in FIG. 5, for example, the substrate 572 is a monolithic piece of metal or metal alloy which operates as a heat sink for the die 542, where the die 542 operates as a high-power chip generating heat that needs to be dissipated. In other embodiments, the substrate 572 represents a plurality of materials with the material to which the metal outer layer 552 is bonded being conductive. The substrate 572, for instance, has a metal or metal alloy ground layer over a printed circuit board (PCB) material, such as a glass-reinforced epoxy laminate sheet. The substrate 572 extends beyond the dimensions of the back side of the die 542 to which it is mounted. For some embodiments, additional dies and/or electronic components are mounted to the substrate 572, and the conductive material of the substrate operates as a common ground for the multiple dies and/or components.

The metal outer layer 552 and the die attach material 562, as shown in FIG. 5, extend beyond the width of the back side of the die 542 so the back edge of the die 542 is encapsulated by the metal outer layer 552 and the die attach material 562. Encapsulate, as used here, means to surround and encase. The metal outer layer 552 is deposited partially on the lateral side of the die, as shown and previously described. The die attach material 562 bonds or adheres to the metal outer layer 552 on both the back and lateral sides of the die 542. The resulting metal outer layer and die attach material combination is layered over the back edge of the die 542 and any back corners where the back edge abruptly changes direction. This encapsulation, as shown in cross section, protects the otherwise exposed and relatively fragile back edge of the die 542 from sustaining unwanted damage during further processing and/or handling. The encapsulation also increases the efficiently of heat transfer from the die 542 through the metal outer layer 552 and die attach material 562 to the substrate 572 during high-power applications.

For some embodiments, the die attach material 562 is a sintered metal, for example, a silver-containing or copper-containing paste which can be sintered using heat and/or pressure to create a eutectic bond between the metal outer layer 552 of the die 542 and the metal of the substrate 572. In a particular embodiment, the metal outer layer 552 is a gold layer and the substrate 572 is a copper flange. For different embodiments, sintered silver or copper creates a eutectic bond between a metal outer layer 552 of gold, silver, copper, nickel or alloy thereof and a substrate 572 of gold, silver, copper, nickel or alloy thereof. In general, the die attach material 562 can be any sinter material which creates a eutectic bond between a metal used for the metal outer layer 552 and a metal used for the substrate 574.

In other embodiments, the die attach material 562 is a conductive adhesive. For example, the die attach material 562 is metal-containing epoxy or paste that cures to form a durable polymer which is highly conductive and therefore allows the substrate 572 to operate together with the metal outer layer 552 as a common ground. In a particular embodiment, the die attach material 562 is a silver epoxy containing silver particles. For an alternate embodiment, the die attach material 562 is solder, and a metal of the substrate 572 is soldered to the metal outer layer 552 of the die 542.

Figure 6:
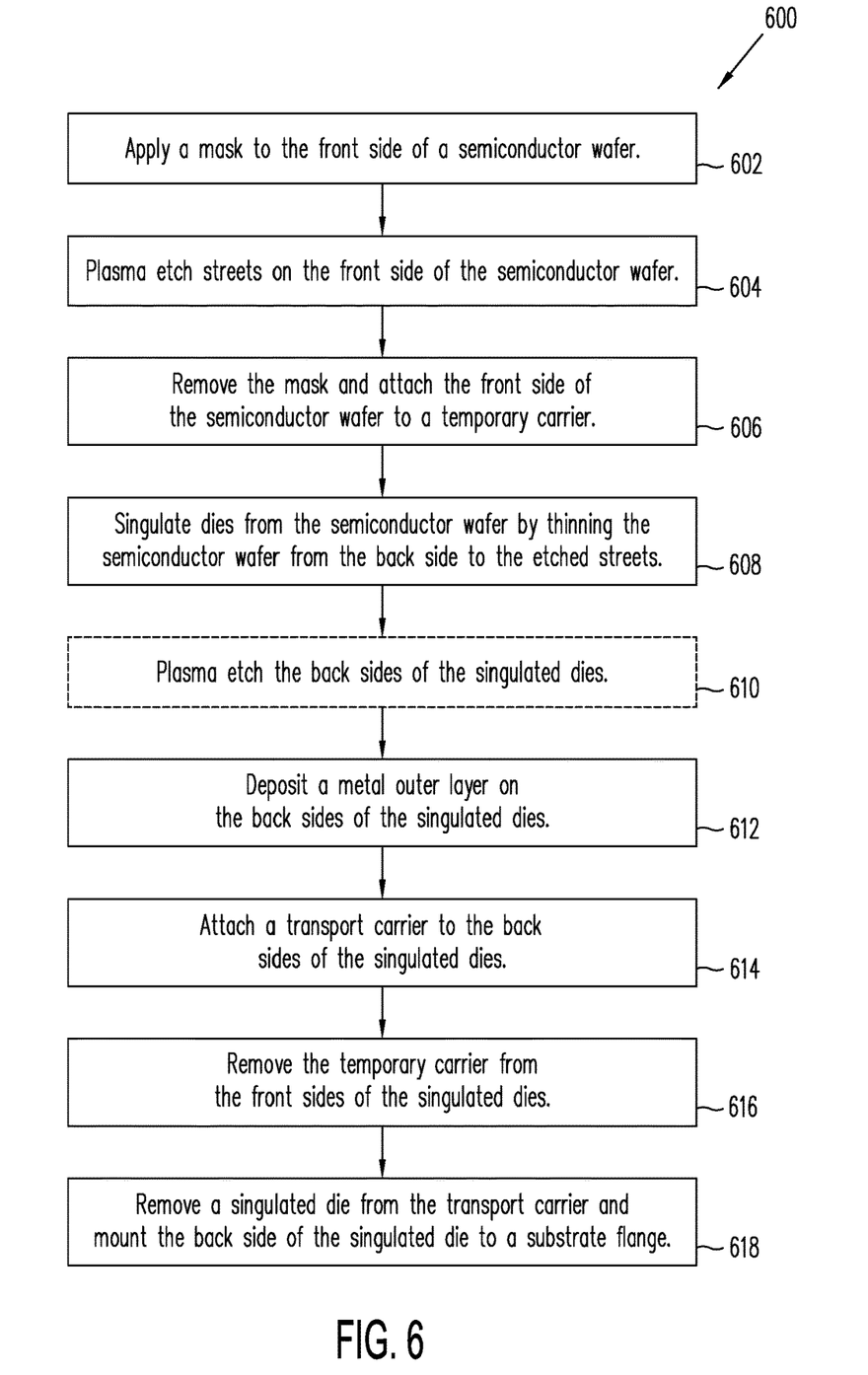
FIG. 6 shows a logical flow diagram illustrating a method for singulating and metalizing dies, in accordance with some embodiments.
Figure 7:
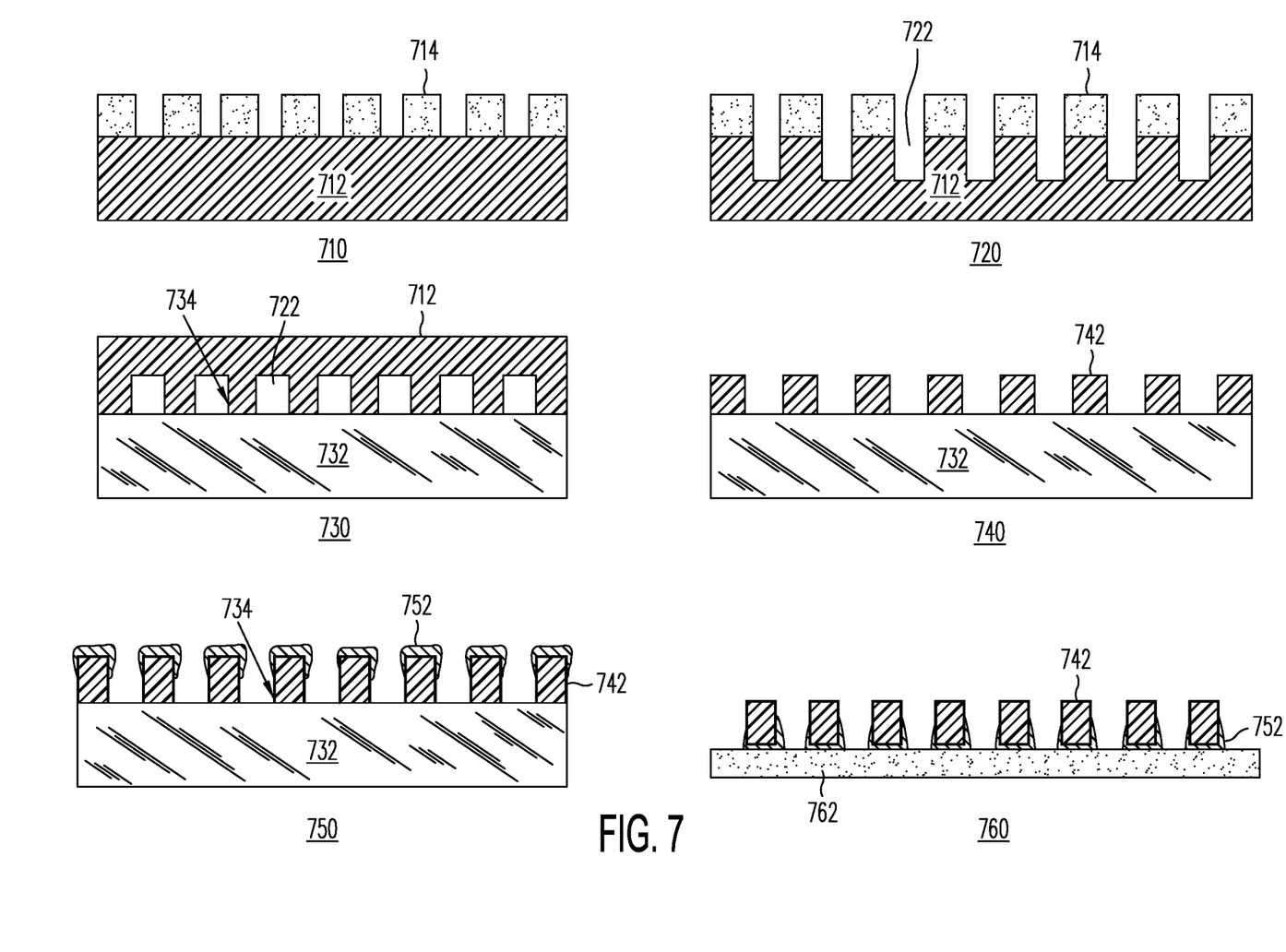
FIG. 7 shows a sequence of cross-sectional views illustrating dies being singulated and metalized, in accordance with some embodiments.

FIG. 6 shows a method 600, illustrated as a logical flow diagram, for singulating semiconductor dies by dicing before grinding (DBG) prior to depositing a metal outer layer on the back sides of the dies. The method 600 is described with reference to FIG. 7, which includes six corresponding cross-sectional views 710, 720, 730, 740 750, 760. In particular, FIG. 7 shows a semiconductor wafer 712, a mask 714, a temporary carrier 732, singulated dies 742, a deposited metal outer layer 752, and a transport carrier 762. For various embodiments, unless stated otherwise, characteristics of the semiconductor wafer 712, the mask 714, the temporary carrier 732, the singulated dies 742, the deposited metal outer layer 752, and the transport carrier 762 are similar or identical to those described for the semiconductor wafer 312, the mask 314, the temporary carrier 332, the singulated dies 342, the deposited metal outer layer 352, and the transport carrier 362, respectively, with reference to FIGS. 2 and 3.

The method 600 begins with applying 602 the mask 714 to the front side of the wafer 712, as shown in view 710. In various embodiments, the wafer is between about 600 and about 800 microns in thickness, although the wafer may be thinner or thicker, as well. As pictured in view 710, the wafer 712 has not yet been thinned and is approximately 30 mils or 762 microns thickness. The mask 714 includes openings that expose the areas on the front side of the wafer 712 that are to be plasma etched. Those areas covered by the mask 714 are not etched, and those areas not covered by the mask 714 are etched.

The method 600 continues with plasma etching 604 streets 722 on the front side of the wafer 712, as shown in view 720. In various embodiments, the streets 722 are etched into the front side of the wafer 712 to a depth of between about 50 and about 100 microns, although the streets 722 may be shallower or deeper, as well. As pictured, the streets 722 have a width of roughly 10 microns and are etched to a depth of approximately 75 microns. Here, etching the semiconductor wafer 712 includes etching the front side of the wafer 712 by plasma dicing to partially singulate the dies 742. Partially singulated dies, such as shown in views 720 and 730, are dies having a front and/or back face defined by etching a wafer but which are not fully singulated from the wafer (i.e., the streets 722 do not extend through the entire thickness of the wafer 712).

The method 600 continues with removing 606 the mask 714 from the front side of the wafer 712 and attaching 606 the front side of the wafer 712 to the temporary carrier 732. View 730 shows the wafer 712 rotated from its front-side-up orientation in view 720 to a front-side-down orientation. Attaching the front side of the wafer 712 to the temporary carrier 732 protects the front side of the wafer 712 as operations on the wafer 712 continue. The attachment is made using an adhesive, specifically, an adhesive which is removable without damaging the front sides of the singulated dies 742. For one embodiment, a portion of the adhesive extends beyond an interface between the front side of the partially singulated dies and the temporary carrier 732 to adhere near the front edge on the lateral sides 734 of the partially singulated dies.

The method 600 continues with singulating 608 the dies 742 from the wafer 712 by thinning the wafer 712 from the back side to meet the etched streets 722. A backgrinding process is used, for example, to thin the wafer 712 down to about 50 microns, more or less. Once the wafer 712 is thinned from the back side to a thickness of less than the depth of the streets 722 etched into the wafer's front side, the wafer 712 separates into the completely singulated dies 742 shown in view 740. Coordinating the extent of the thinning process with the depth of the etching process achieves a predetermined thickness for the singulated dies 742.

Some implementations, indicated in FIG. 6 by a broken line, of the method 600 include optionally plasma etching 610 the back sides of the singulated dies 742 as a surface preparation treatment. Thinning the wafer 712 mechanically by backgrinding between views 730 and 740, for example, leaves behind surface damage in the form of scratches, micro-fissures, chipped back edges, and stressed areas that weaken the dies 742. This surface damage, along with possible surface deposits, is partially or fully removed using reactive-ion etching (RIE) with a chemically reactive plasma.

After singulating 608 the dies 742, the method 600 continues with depositing 612 the metal outer layer 752 on the back sides of the dies 742 as shown in view 750 and as described for the deposition of the metal outer layer 352 on the back sides of the dies 342 in the method 200 (208) with reference to view 340 and FIG. 3. According to an embodiment, the metal outer layer 752 is simultaneously deposited on the back sides of the plurality of singulated dies 742 while the plurality of singulated dies 742 are held in fixed relative positions, with respect to each other, by the temporary carrier 732. For an embodiment previously described with reference to view 730, a portion of the adhesive between the wafer 712 and the temporary carrier 732 partially adhered to the lateral sides 734 of the partially singulated dies. The adhesive at 734 operates to prevent the metal back layer 752 from depositing near the front side of the dies 742. In one instance, the metal outer layer 752 does not adhere to the adhesive. In another instance, any portion of the metal outer layer that does adhere to the adhesive is removed with the adhesive when the temporary carrier 732 is removed from the front sides of the dies 742.

Attaching 614 the transport carrier 762 to the back sides of the singulated dies 742 and removing 616 the temporary carrier 732 from the front sides of the singulated dies 742, illustrated in view 760, proceeds as described for the method 200 (210, 212) with the transport carrier 362, the dies 342, the temporary carrier 332, and reference to view 350. Similarly, removing 618 a singulated die 742 from the transport carrier 762 and mounting 618 the back side of the die 742 to a substrate proceeds as described for the method 200 (214) with reference to FIG. 5.

Figure 8:
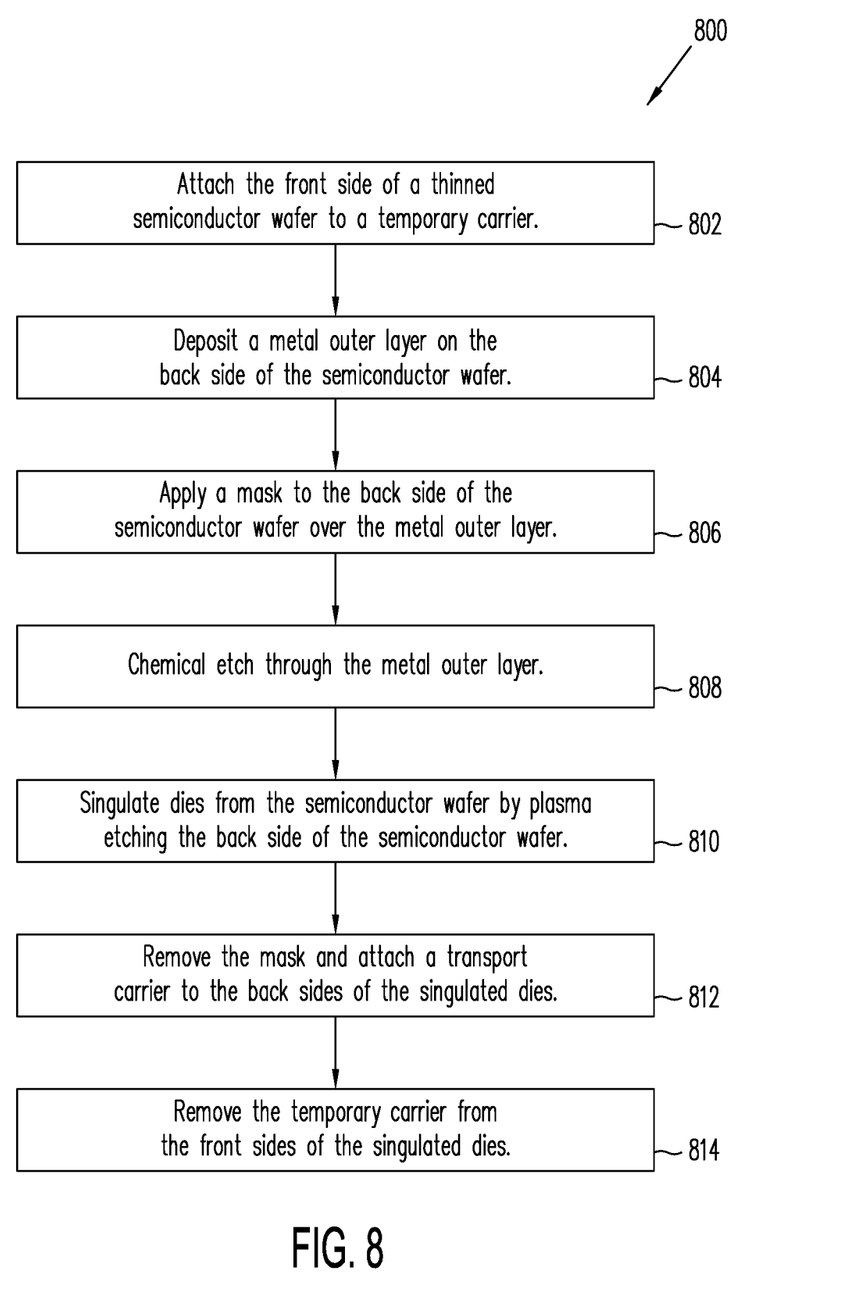
FIG. 8 shows a logical flow diagram illustrating a method for metalizing and singulating dies, in accordance with some embodiments.
Figure 9:
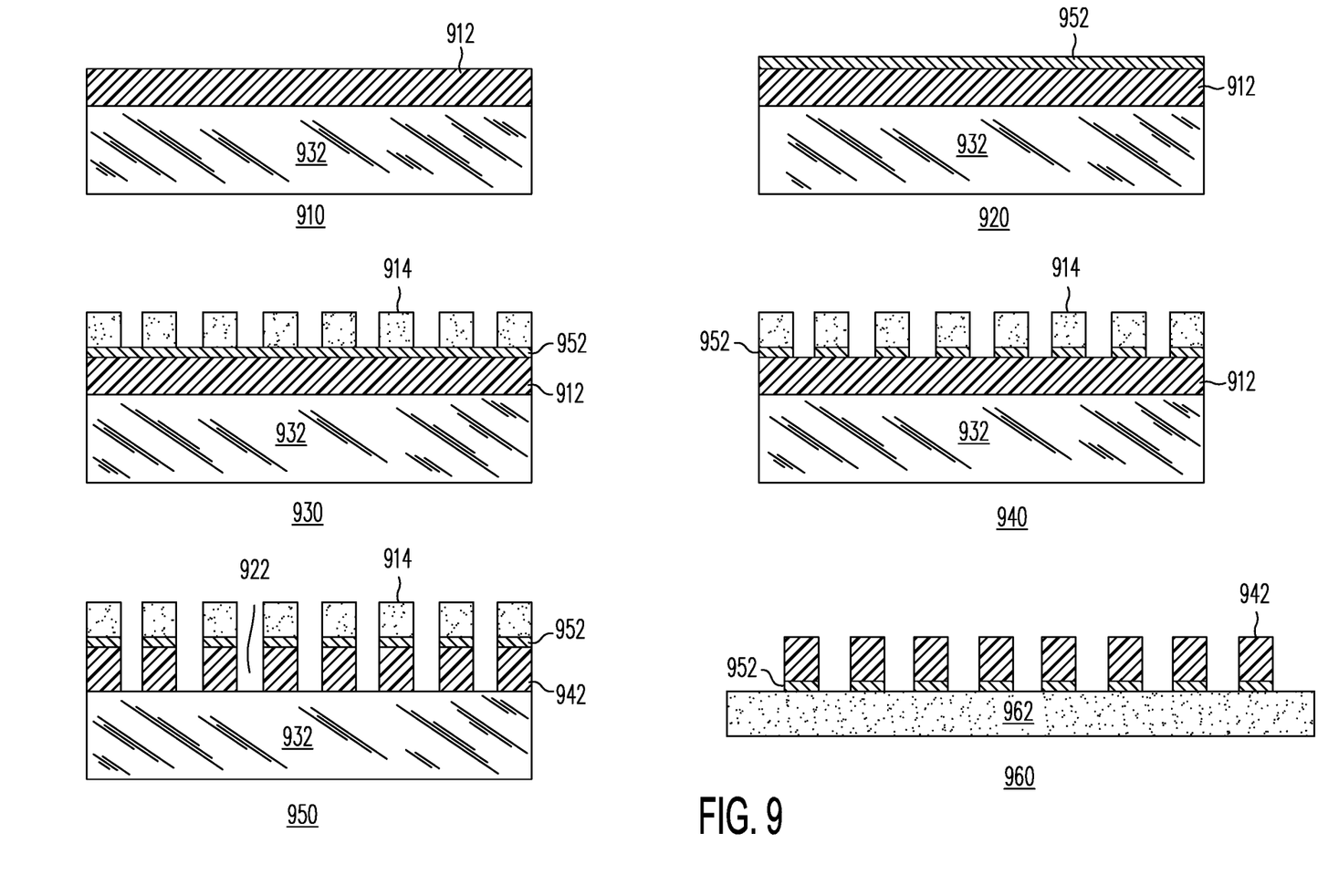
FIG. 9 shows a sequence of cross-sectional views illustrating dies being metalized and singulated, in accordance with some embodiments.

FIG. 8 shows a method 800, illustrated as a logical flow diagram, for singulating dies using DRIE by dicing post grinding (DPG) after depositing a metal outer layer on the back side of a wafer. The method 800 is described with reference to FIG. 9, which includes six corresponding cross-sectional views 910, 920, 930, 940, 950, 960. In particular, FIG. 9 shows a thinned semiconductor wafer 912, a mask 914, a temporary carrier 932, singulated dies 942, a deposited metal outer layer 952, and a transport carrier 962. For various embodiments, unless stated otherwise, characteristics of the thinned semiconductor wafer 912, the mask 914, the temporary carrier 932, the singulated dies 942, the deposited metal outer layer 952, and the transport carrier 962 are similar or identical to those described for the semiconductor wafer 312, the mask 314, the temporary carrier 332, the singulated dies 342, the deposited metal outer layer 352, and the transport carrier 362, respectively, with reference to FIGS. 2 and 3.

The method 800 begins with attaching 802 the front side of the semiconductor wafer 912 to the temporary carrier 932, as shown in view 910 and as described for the method 200 (202) with reference to view 310. The method 800 continues with depositing 804 the metal outer layer 952 on the back side of the thinned semiconductor wafer 912. The metal outer layer 952 is deposited on the back side of the semiconductor wafer 912 as shown in view 920 and as described for the method 200 (208) with the exceptions that the metal outer layer 952, and any stacked metal layers underneath, are deposited before the application of the mask 914 and no portion of the metal outer layer 952 deposits on the lateral sides of the dies 942, which are not yet singulated.

The application 806 of the mask 914 to the back side of the wafer 912 to define the location of streets 922 occurs over the previously deposited metal outer layer 952, as shown in view 930. The portion of the metal outer layer 952 left exposed over the semiconductor material of the wafer 912 does not lend itself to removal by plasma dicing. Therefore, as illustrated in view 940, the exposed portions of the metal outer layer 952 are first removed by chemical etching 808 to expose underlying portions of the back side of the semiconductor wafer 912. The method 800 then continues with plasma dicing 810 the exposed portions of the back side of the semiconductor wafer 912 to singulate 810 the dies 942, as pictured in view 950, after which the mask 914 is removed 812 from the back sides of the singulated dies 942 having the die streets 922 between them.

Attaching 812 the transport carrier 962 to the back sides of the singulated dies 942, and then removing 814 the temporary carrier 932 from the front sides of the singulated dies 942 occurs as shown in view 960 and as described for the method 200 (210, 212) with reference to view 350. After transport, the dies 942 meeting quality control standards are separated from the transport carrier 962 and integrated into die packages in accordance with their designated uses.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

Moreover in this document, the terms "comprises," "comprising," "has," "having," "includes," "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially," "essentially," "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to," "configured with," "arranged to," "arranged with," "capable of" and any like or similar terms means that referenced elements have a physical arrangement and/or physical coupling and/or connectivity with other elements in an inactive state. This physical arrangement and/or physical coupling and/or connectivity while in the inactive state enables the elements to perform stated functionality while in the active state. Although the various circuit schematics shown herein depict certain example arrangement of elements, additional intervening elements, devices, features, or components may be present in an actual embodiment, assuming that the functionality of the given circuit is not adversely affected.

Also, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A packaged die comprising:
a semiconductor die having a front side opposite a back side, a plasma-etched lateral side adjacent to the front side and the back side, and a back edge where the back side and the plasma-etched lateral side meet, the semiconductor die comprising:
a base semiconductor substrate;
build up layers formed over the base semiconductor substrate to define the front side of the semiconductor die; and
a radio frequency (RF) device formed in the base semiconductor substrate and in the build-up layers;
a metal outer layer deposited on the back side of the semiconductor die and on a portion of the plasma-etched lateral side of the semiconductor die nearest the back side, wherein the metal outer layer extends on the plasma-etched lateral side from the back side toward the front side, while terminating before reaching the front side of the semiconductor die;
a substrate; and
an electrically-conductive die attach material bonding the semiconductor die to the substrate, the RF power device electrically coupled to the substrate through the electrically-conductive die attach material and through the metal outer layer.

2. The packaged die of claim 1, wherein the metal outer layer comprises at least one of:
gold;
silver;
copper; or
nickel.

3. The packaged die of claim 1, wherein the electrically-conductive die attach material comprises:
a sintered metal;
a conductive adhesive; or
a solder.

4. The packaged die of claim 1, wherein the metal outer layer and the electrically-conductive die attach material extend beyond a width of the back side of the semiconductor die so the back edge of the semiconductor die, where the back side and the plasma-etched lateral side of the semiconductor die meet, is encapsulated by the metal outer layer and the electrically-conductive die attach material.

5. The packaged die of claim 1, wherein the substrate comprises one or more of gold, silver, copper, nickel and an alloy thereof.

6. The packaged die of claim 1, wherein the substrate comprises a copper flange.

7. The packaged die of claim 1, wherein the substrate comprises a metal or metal alloy ground layer over a printed circuit board material.

8. A packaged die comprising:
a semiconductor die having a front side opposite a back side, four plasma-etched lateral sides adjacent to the front and back sides, and four back edges where the back side and the four plasma-etched lateral sides meet;
a metal outer layer deposited on the back side of the semiconductor die and on portions of the four plasma-etched lateral sides of the semiconductor die nearest the back side, wherein the metal outer layer extends on the four plasma-etched lateral sides from the back side toward the front side, while terminating before reaching the front side of the semiconductor die;
a substrate; and
a die attach material between the substrate and the metal outer layer, wherein the die attach material bonds the semiconductor die to the substrate, and wherein the die attach material also extends over the metal outer layer on the four plasma-etched lateral sides from the back side toward the front side, while terminating before reaching the front side of the semiconductor die;
wherein the semiconductor die comprises a singulated piece of an RF power wafer and contains an RF power device, the RF power device electrically coupled to an electrically-grounded region of the substrate through the die attach material and through the metal outer layer deposited on the back side and the four plasma-etched later sides of the semiconductor die.

9. The packaged die of claim 8, wherein the metal outer layer comprises at least one of:
gold;
silver;
copper; or
nickel.

10. The packaged die of claim 8, wherein the die attach material comprises:
a sintered metal;
a conductive adhesive; or
a solder.

11. The packaged die of claim 10, wherein the die attach material comprises:
sintered silver; or
sintered copper.

12. The packaged die of claim 8, wherein the substrate comprises one or more of gold, silver, copper, nickel and an alloy thereof.

13. The packaged die of claim 8, wherein the substrate comprises a copper flange.

14. The packaged die of claim 8, wherein the substrate comprises a metal or metal alloy ground layer over a printed circuit board material.

15. The packaged die of claim 1, wherein the metal outer layer directly contacts the back side and plasma-etched lateral side of the semiconductor die.

16. The packaged die of claim 1, wherein the metal outer layer covers between 20% and 80% of the plasma-etched lateral side of the semiconductor die, by surface area.

17. The packaged die of claim 1, wherein the plasma-etched lateral side of the semiconductor die has a concave profile.

18. The packaged die of claim 8, wherein the metal outer layer directly contacts the back side and the four plasma-etched lateral sides of the semiconductor die.

19. The packaged die of claim 8, wherein the metal outer layer covers between 20% and 80% of the four plasma-etched lateral sides of the semiconductor die, by surface area.

20. The packaged die of claim 8, wherein at least one of the four plasma-etched lateral sides of the semiconductor die has a concave profile.

* * * * *